United States Patent
Kim et al.

(10) Patent No.: US 11,397,381 B2
(45) Date of Patent: Jul. 26, 2022

(54) MULTISCALE ALL-SOFT ELECTRONIC DEVICES AND CIRCUITS BASED ON LIQUID METAL

(71) Applicant: Georgia Tech Research Corporation, Atlanta, GA (US)

(72) Inventors: Mingu Kim, Atlanta, GA (US); Oliver Brand, Atlanta, GA (US); Devin K. Brown, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/875,572

(22) Filed: May 15, 2020

(65) Prior Publication Data
US 2020/0365296 A1 Nov. 19, 2020

Related U.S. Application Data

(60) Provisional application No. 62/864,571, filed on Jun. 21, 2019, provisional application No. 62/849,372, filed on May 17, 2019.

(51) Int. Cl.
*G03F 7/00* (2006.01)
*H01B 13/00* (2006.01)
(Continued)

(52) U.S. Cl.
CPC .............. *G03F 7/0002* (2013.01); *H01B 1/16* (2013.01); *H01B 1/22* (2013.01); *H01B 7/0027* (2013.01);
(Continued)

(58) Field of Classification Search
None
See application file for complete search history.

(56) References Cited

U.S. PATENT DOCUMENTS 6,957,608 B1 * 10/2005 Hubert ................ H01L 51/0021
101/28
9,228,822 B2    1/2016 Majidi et al.
(Continued)

FOREIGN PATENT DOCUMENTS

WO    2019046335 A1    3/2019

OTHER PUBLICATIONS

Gozen, B. Arda, et al. "High-density soft-matter electronics with micron-scale line width." Advanced Materials 26.30 (2014): 5211-5216. (Year: 2014).*

(Continued)

*Primary Examiner* — Katie L. Hammer
(74) *Attorney, Agent, or Firm* — Bryan W. Bockhop; Bockhop Intellectual Property Law, LLC

(57) ABSTRACT

In a method making a flexible electrical conductor, a mask layer (216) is applied to a substrate (210). A portion of the mask layer (216) is removed to expose the substrate (210) in an exposed shape (220) corresponding to the conductor. A liquid phase conductor (232) is applied to the portion of the substrate (210). The mask layer (216) is dissolved with a solvent (238) to leave a shaped liquid phase conductor (234) corresponding to the exposed shape on the substrate (210). A primary elastomer layer (240) is applied onto the substrate (210) and the shaped liquid phase conductor (234). The primary elastomer layer (240) and the shaped liquid phase conductor (234) are removed from the substrate (210). A secondary elastomer layer (242) is applied to the shaped liquid phase conductor (234) and the primary elastomer layer (240) to seal the shaped liquid phase conductor (234) therein.

25 Claims, 3 Drawing Sheets

(51) Int. Cl.
  H01B 13/32  (2006.01)
  H01B 1/16   (2006.01)
  H01B 1/22   (2006.01)
  H01B 7/00   (2006.01)

(52) U.S. Cl.
  CPC ....... H01B 13/0026 (2013.01); H01B 13/322 (2013.01)

(56) References Cited

U.S. PATENT DOCUMENTS

| | | | |
|---|---|---|---|
| 9,437,922 B2 | 9/2016 | Dickey et al. | |
| 10,538,844 B2 | 1/2020 | Bishop et al. | |
| 10,581,137 B2 | 3/2020 | Hussain et al. | |
| 2004/0013982 A1* | 1/2004 | Jacobson | H01L 51/0014 430/320 |
| 2015/0357078 A1* | 12/2015 | Lessing | H01B 1/24 73/774 |
| 2017/0218167 A1 | 8/2017 | Majidi et al. | |
| 2019/0019593 A1 | 1/2019 | Guo et al. | |
| 2019/0094089 A1 | 3/2019 | Lewis et al. | |

OTHER PUBLICATIONS

WIPO: "Notification of Transmittal of the International Search Report and the Written Opinion of the International Searching Authority, or the Declaration"; dated Dec. 1, 2020; ISR in related PCT Application No. PCT/US2020/033174.

Khondoker et al.: "Fabrication methods and applications of microstructured gallium based liquid metal alloys"; 2016; Smart Mater. Struct. 25 (2016) 093001.

Kim et al.: "Multiscale Liquid Metal Thin-Film Patterning Based on Soft Lithography for Skin-Mountable, Soft and 3D-Integrated Biological Microsystems"; Jun. 7, 2018; Solid State Sensors, Actuators and Microsystems Workshop, Hilton Head Island, South Carolina.

Min-Gu Kim: "Size-Scalable and High-Density Liquid-Metal-Based Soft Electronic Passive Components and Circuits Using Soft Lithography"; 2017; Adv. Funct. Mater. 1604466.

* cited by examiner

MULTISCALE ALL-SOFT ELECTRONIC DEVICES AND CIRCUITS BASED ON LIQUID METAL

CROSS-REFERENCE TO RELATED APPLICATION(S)

This application claims the benefit of U.S. Provisional Patent Application Ser. No. 62/849,372, filed May 17, 2019; this application also claims the benefit of U.S. Provisional Patent Application Ser. No. 62/864,571, filed Jun. 21, 2019, the entirety of each of which is hereby incorporated herein by reference.

STATEMENT OF GOVERNMENT SUPPORT

This invention was made with government support under 1542174, awarded by the National Science Foundation. The government has certain rights in the invention.

BACKGROUND OF THE INVENTION

1. Field of the Invention

The present invention relates to electronic circuits and, more specifically, to electronic circuits with stretchable passive elements and circuits.

2. Description of the Related Art

Progress in soft functional material synthesis and manufacturing technology has enabled bioinspired and skin-like soft electronics for applications ranging from entertainment to healthcare. Unlike conventional solid-state electronics, soft electronics can be lightweight, stretchable, and reconfigurable, with biocompatible characteristics for skin-mountable and wearable sensing electronics. Flexible and stretchable characteristics can be achieved by using either 2D or 3D compliant wave-like, solid metal patterns or elastic conductors based on conductive nanomaterials embedded in a polymer matrix.

An alternative approach to realize all-soft microsystems is the use of intrinsically soft conductors, such as gallium-based liquid metal such as eutectic gallium-indium alloy (EGaIn), which is a liquid phase conductor at room temperature. The use of EGaIn in flexible electronics can be desirable due to its nontoxicity, mechanical stability (virtually unlimited stretchability), thermal conductivity and electrical conductivity. The low melting temperature and negligible vapor pressure of EGaIn facilitate room-temperature and ambient pressure manufacturing processing. Moreover, thanks to the formation of a thin oxide layer on the EGaIn surface under atmospheric oxygen level, EGaIn structures maintain their mechanical shapes, allowing formation of EGaIn patterns on soft elastomeric substrates.

For interfacing with individual cells, the ability to pattern submicrometer metallic structures embedded in soft substrates is of significant interest. Considering the size of a single biological cell, such as platelets with a diameter of 2-3 μm, mechano-transducers should be manufactured with submicron scale features and soft, biomimetic properties. Existing fabrication technologies, including the transfer printing of compliant solid metal patterns, nanoprinting, direct printing of nanomaterials, and EGaIn patterning, are currently not suitable to fabricate such soft and stretchable electronic devices with submicron-scale resolution.

Certain existing EGaIn circuit production methods place EGaIn in a channel defined by an elastomer. The channel can be shaped in the form of passive electronic components. Unfortunately, existing processes have difficulty making wires that have a width greater than 500 μm. Such widths can be useful in power distribution networks, ground planes and other circuit elements.

Therefore, there is a need for flexible circuit elements and a method for making such elements employing soft conductors.

SUMMARY OF THE INVENTION

The disadvantages of the prior art are overcome by the present invention which, in one aspect, is a method of making a flexible electrical element configured to conduct electricity while at a normal operating temperature, in which a stamp is generated so as to have a shaped surface corresponding to the flexible electrical element. A liquid phase conductor is applied to the shaped surface. The liquid phase conductor includes a material that remains liquid while at the normal operating temperature of the flexible electrical element. The stamp is stamped onto a receptive surface of a primary elastomer layer. The receptive surface has an aspect that causes the liquid phase conductor from the shaped surface to remain on the receptive surface of the primary elastomer layer when the stamp is removed therefrom. A secondary elastomer layer is applied to the elastomer substrate so as to seal the liquid phase conductor onto the elastomer substrate.

In another aspect, the invention is a method making a flexible electrical conductor configured to conduct electricity while at a normal operating temperature, in which a mask layer is applied to a substrate. A portion of the mask layer is removed so as to expose a portion of the substrate in an exposed shape corresponding to the flexible electrical conductor. A liquid phase conductor is applied to the portion of the substrate. The mask layer is dissolved with a solvent so as to leave a shaped liquid phase conductor corresponding to the exposed shape on the substrate. A primary elastomer layer is applied onto the substrate and the shaped liquid phase conductor. The primary elastomer layer and the shaped liquid phase conductor are removed from the substrate. A secondary elastomer layer is applied to the shaped liquid phase conductor and the primary elastomer layer so as to seal the shaped liquid phase conductor therein.

In yet another aspect, the invention is an electronic element that includes an elastomer member defining a channel. The channel has a length and a width that are at least 500 μm. A liquid phase conductor fills the channel.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
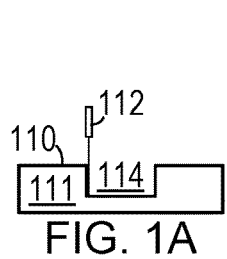
FIGS. 1A-1H include a series of schematic diagrams demonstrating a first embodiment of a method of making flexible electronic elements.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Parylene is a common name for a variety of chemical vapor deposited poly(p-xylylene) polymers.

As shown in FIGS. 1A-1H, in one embodiment of a method of making a flexible electrical element that is configured to conduct electricity while at a normal operating temperature, material is removed from a substrate 111 using a common lithography method, such as by using an e-beam lithography device 112 so as to form a stamp 110, as shown in FIG. 1A. The stamp 110 is shaped so as to have a surface corresponding to the desired shape of the flexible electrical element. The stamp 110, if made from a flexible elastomer (such as polydimethylsiloxane (PDMS)), can define a narrow channel 114 (e.g., narrower than about 500 µm) that follows the path of a desired narrow wire.

Figure 1B:
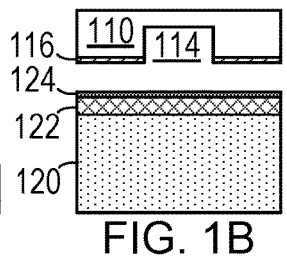

As shown in FIG. 1B, a donor layer 120 (which can also include PDMS) is coated with a liquid phase conductor 122 (such as EGaIn or other eutectic alloy), which remains in a liquid form while at the normal operating temperature (e.g., room temperature) of the flexible electrical element. If EGaIn is used, a roughly 1-3 nm layer 124 of gallium oxide will form on its top surface. The shaped outer surface of the stamp 110 can be coated with a chemical modifier 116 (such as with toluene) to attract the liquid phase conductor 122 thereto.

Figure 1C:
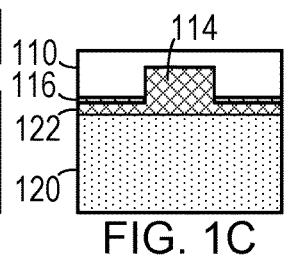
Figure 1D:
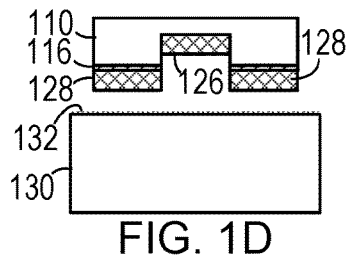
Figure 1E:
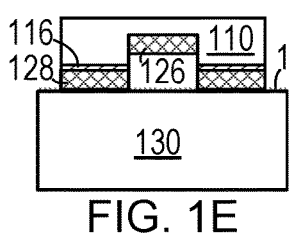

As shown in FIG. 1C, the stamp 110 is pressed against the liquid phase conductor 122, which causes the liquid phase conductor 122 to enter the channel 114 and adhere to the chemically modified surface 116 of the stamp. (It should be noted that such a narrow channel is not used in some applications, such as ones that generate flexible elements having widths of at least about 500 µm.) This stamping action can be repeated several times for more complete adhesion of the liquid phase conductor 122 to the stamp 110. As shown in FIGS. 1D-1E, the stamp is then stamped against a receptive surface if a primary elastomer layer 130 (e.g., a layer of polydimethylsiloxane). The receptive surface has a treatment 132, or other aspect, that causes the liquid phase conductor 122 from the shaped surface to remain on the receptive surface. In one embodiment, the treatment 132 includes a paper texturing which can be achieved by applying micro cellulose fiber to the receptive surface.

Figure 1F:
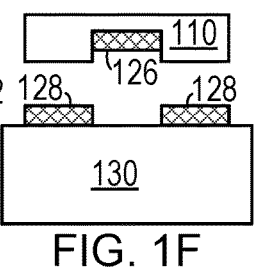
Figure 1G:
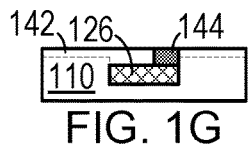
Figure 1H:
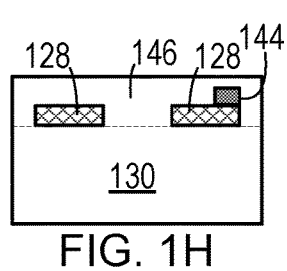

When the stamp 110 is removed, as shown in FIG. 1F, shaped portions 128 of the liquid phase conductor having a shape corresponding to that of the shaped surface of the stamp 110 are left on the surface of the primary elastomer layer 130. If channel 114 in an elastomer stamp 110 is used to form a liquid phase conductor wire 126, as shown in FIG. 1G, then a secondary elastomer layer 142 (such as a polydimethylsiloxane layer) is placed against the stamp 110 to encapsulate the wire 126. A flexible via 144 can be used to connect the liquid phase conductor wire 126 to external elements. As shown in FIG. 1H, the shaped portions 128 are encapsulated with a secondary elastomer layer 146 (such as a polydimethylsiloxane layer) to seal the shaped portions 128 to the primary elastomer layer substrate 130, thereby making a flexible circuit element having the desired shape.

Figure 2A:
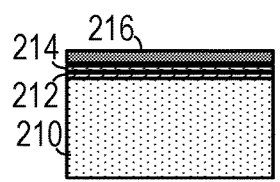
FIGS. 2A-2K include a series of schematic diagrams demonstrating a second embodiment of a method of making flexible electronic elements.
Figure 2B:
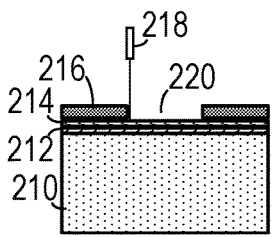
Figure 2C:
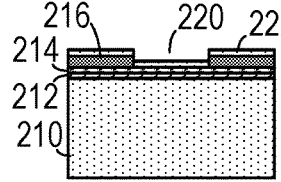
Figure 2D:
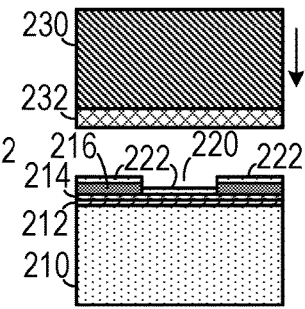
Figure 2E:
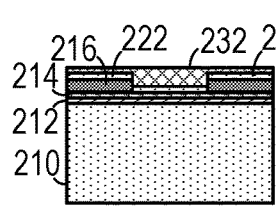
Figure 2F:
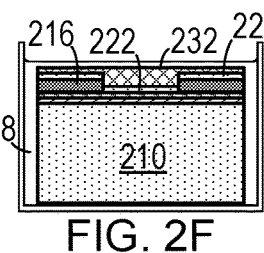
Figure 2G:
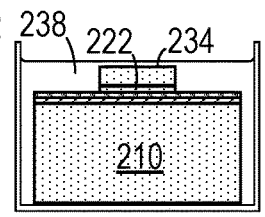
Figure 2H:
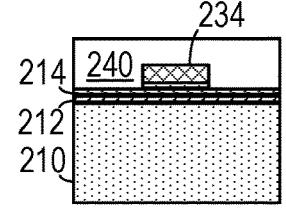
Figure 2I:
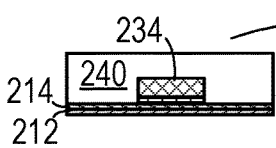
Figure 2J:
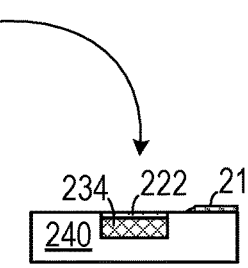
Figure 2K:
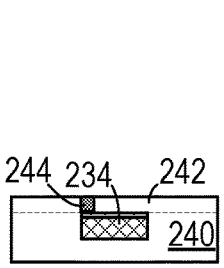

In another embodiment, as shown in FIGS. 2A-2K, a mask layer 216 (such as a poly(methyl methacrylate) layer) is applied to a substrate, which can include a rigid layer 210 (such as silicon or $SiO_2$ layer), onto which is applied a sacrificial layer 212 (such as poly(acrylic acid) (PAA)) and a separation layer 214 (such as parylene C), as shown in FIG. 2A. As shown in FIG. 2B, a portion corresponding to the shape of a desired flexible electrical conductor is removed from the mask layer 216 so as to generate an opening 220 in the desired shape of the conductor that exposes the sacrificial layer 212. This can be done using a conventional circuit lithography method, such as e-beam lithography 218. As shown in FIG. 2C, an adhesion layer 222 (such as a thin film of Ti/Au at 5 nm to 30 nm in thickness, in one embodiment) having an affinity for the liquid phase conductor is applied to all exposed surfaces. As shown in FIG. 2D, a liquid phase conductor layer 232 (such as EGaIn) is applied to a stamp 230 (such as a PDMS layer), which is pressed against the adhesion layer 222. When the stamp is removed, as shown in FIG. 2E, the liquid phase conductor layer 232 adheres to the adhesion layer 222. By using a suitable solvent 238 (such as acetone when the mask layer comprises PMMA), as shown in FIG. 2F, the remaining mask layer 216 is removed, leaving the liquid phase conductor layer 232 in the desired shape, as shown in FIG. 2G. As shown in FIG. 2H, a primary soft elastomer layer 240 (such as PDMS) is applied to the liquid phase conductor layer 232 and the exposed portions of the separation layer 214. As shown in FIG. 2I, the soft elastomer layer 240, the remaining liquid phase conductor layer 232, the separation layer 214 and the sacrificial layer 212 are removed from the rigid layer 210. As shown in FIG. 2J, the separation layer 214 is then etched away so as to expose the primary soft elastomer layer 240 and liquid phase conductor layer 232 (and the trace amount of the remaining adhesion layer 222). As shown in FIG. 2K, the secondary soft elastomer layer 242 (such as PDMS) is applied so as to encapsulate the liquid phase conductor layer 232. A via 244 can also be applied to couple the component to other components. Micro-scale elements (e.g., light emitting diodes, microchips, etc.) can also be embedded in the elastomer layers to add functionality.

Figure 3:
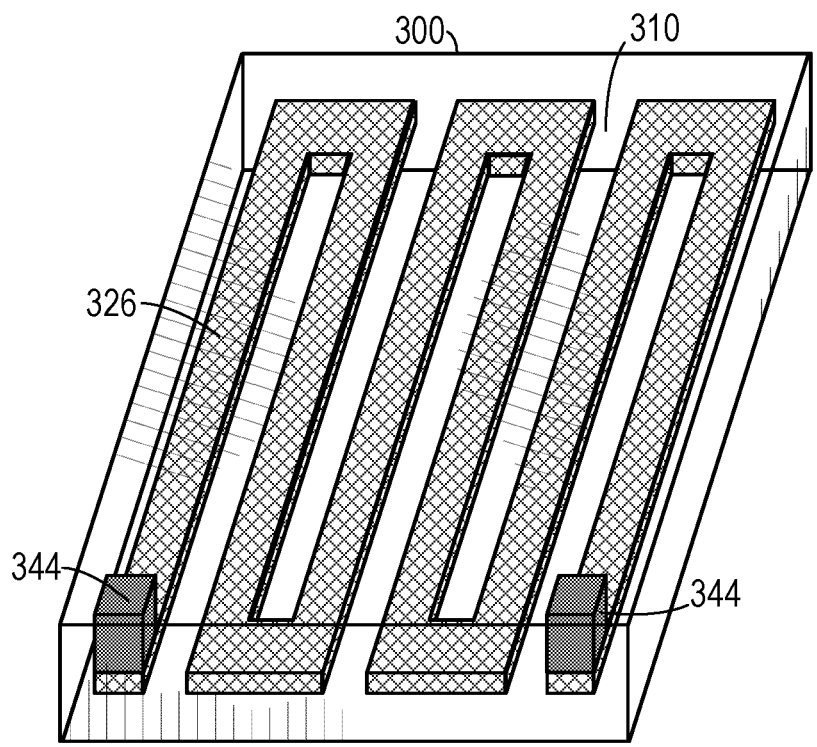
FIG. 3 is a schematic diagram of a flexible resistor.
Figure 4A:
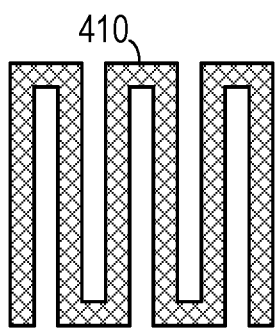
FIGS. 4A-4C are schematic diagrams of a flexible resistor, a flexible inductor and a flexible capacitor, respectively, made according to one representative embodiment of the invention.
Figure 4B:
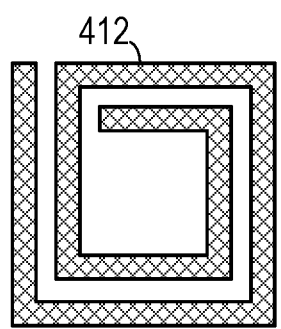
Figure 4C:
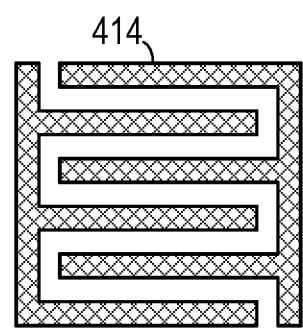
Figure 5:
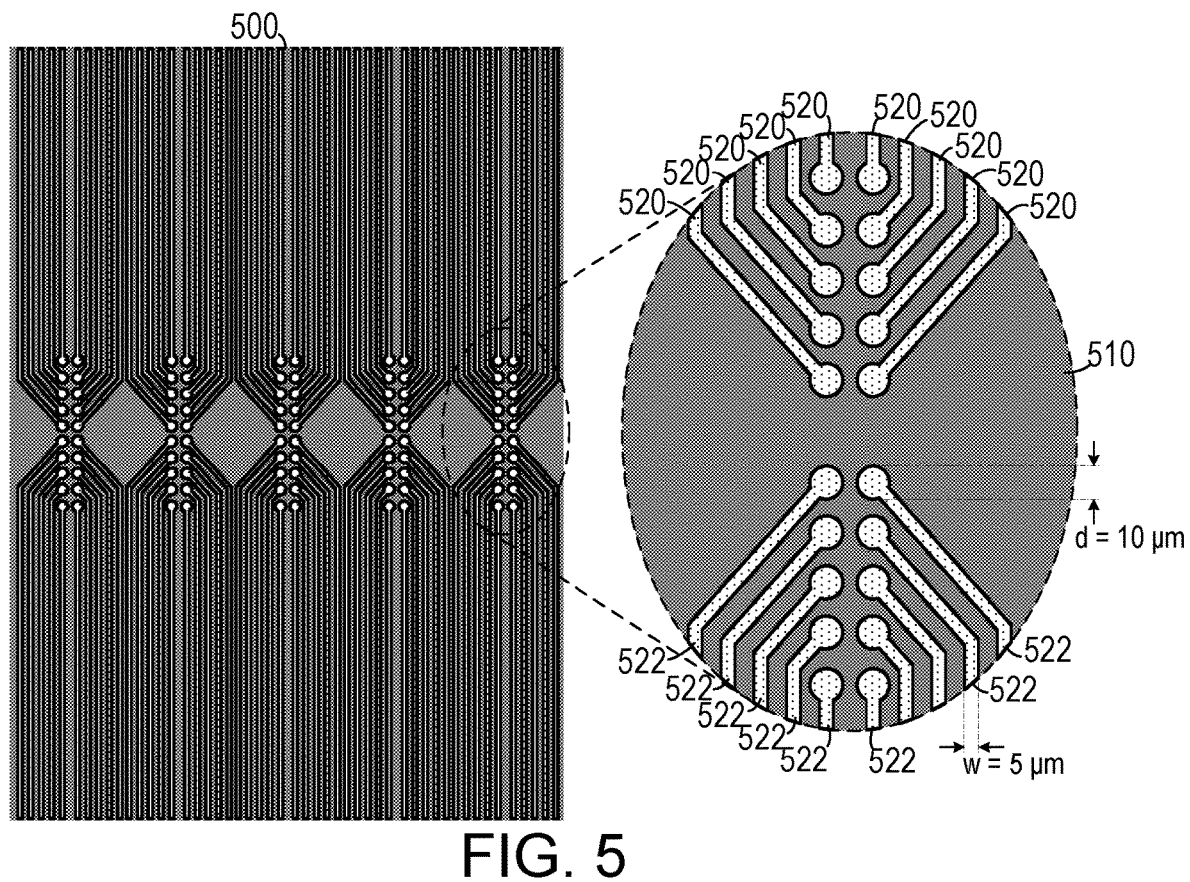
FIG. 5 is a schematic diagram of a flexible electrode array made according to one representative embodiment of the invention.

As shown in FIG. 3, a liquid phase conductor 326 can be shaped so as to act as a passive electronic component 300 that is encapsulated in a soft elastomer block 310 and that can be electrically coupled to other components with vias 344. While this figure shows only a single component, many different components can be integrated into a single soft elastomer block 310. As shown in FIGS. 4A-4C, such components can include, for example, a resistor 410, an inductor 412 and a capacitor 414. A complex flexible microelectrode array 500 is shown in FIG. 5, in which a first plurality of flexible wires 520 is spaced apart from a second plurality of flexible wires 522, both of which are encapsulated in a soft elastomer material 510.

The following paragraphs describe methods employed in a first experimental embodiment:

Subtractive Reverse Stamping Technique Based on Soft Lithography:

For PDMS mold preparation, a microfabricated photoresist master on a silicon wafer with critical dimension of 2 μm was fabricated. To create the PDMS mold, liquid PDMS (10:1 ratio of PDMS prepolymer and curing agent, Sylgard 184, Dow Corning) was either drop casted or spin coated on the fabricated silicon master molds and cured at 60° C. for 8 hours. A 500 μL droplet of toluene (Toluene, ACS grade, VWR International) was drop-coated on a glass substrate and subsequently dried at room temperature and under atmospheric pressure for 5-10 minutes. Then, the PDMS mold was placed on the glass substrate for chemical surface modification. In the micro-transfer molding process, EGaIn (gallium-indium eutectic, >99.99% trace metal basis, Sigma-Aldrich) was dispensed and spread using a PDMS roller on a donor PDMS substrate. Afterward, the PDMS mold was gently pressed onto the EGaIn thin film and separated from it. Unwanted liquid metal residue on the outside of the channel was transferred to a sacrificial PDMS layer, and this transfer process was repeated several times (≈15 times) until all residue is removed. The EGaIn-filled PDMS mold was then bonded to an additional PDMS layer using either drop casting or spin coating.

Additive Stamping Technique Based on Soft Lithography: For the PDMS stamp preparation, an acrylic master with critical dimension of 500 μm was fabricated using a CO2 laser cutter, and liquid PDMS (10:1 ratio of PDMS prepolymer and curing agent, Sylgard 184, Dow Corning) was drop casted on the fabricated molds and cured at 60° C. for 8 hours. For paper-textured PDMS preparation, a small piece of standard printing paper (Office Depot #348-037) was taped on a flat substrate, and liquid PDMS (10:1 ratio of PDMS prepolymer and curing agent, Sylgard 184, Dow Corning) was either drop casted or spin coated on the paper substrate. After curing at 60° C. for 8 hours, the polymerized PDMS was gently peeled off from the paper substrate. With this process, the micro cellulose fiber structures can be effectively transferred to the PDMS surface. EGaIn (gallium-indium eutectic, >99.99% trace metal basis, Sigma-Aldrich) was dispensed and spread using a PDMS roller on a donor PDMS substrate. The PDMS stamp was gently pressed onto the EGaIn film, and then the EGaIn film was stamped to the paper-textured PDMS substrate. The patterned EGaIn films on the paper-textured PDMS were then sealed by an additional PDMS layer using either drop casting or spin coating, and commercial copper tape was used for electrical contacts. All PDMS samples were polymerized at 60° C. for 8 hours.

Another experimental embodiment includes a hybrid lithography process is introduced that combines electron-beam lithography (EBL) for nano/microstructure fabrication with soft lithography for EGaIn transfer. This hybrid lithography process is applied to a biphasic structure, including a metallic adhesion layer coated with EGaIn. The hybrid fabrication approach enables high-resolution and high-density all-soft electronic devices, including passive electronic components, resistive strain sensor arrays, and microelectrode arrays. In particular, EGaIn thin-film patterning with feature sizes as small as 180 nm and 1 μm line spacing were demonstrated. The intrinsically soft EGaIn structures, patterned by the developed hybrid lithography technique, offer a combination of resolution, electrical conductivity, and electronic/wiring density. Thanks to the intrinsically soft EGaIn properties, the fabricated soft devices can endure mechanical deformation up to 30%, while maintaining electrical functionality.

In an experimental embodiment, the fabrication process typically includes three fundamental steps: nano/microstructure fabrication using EBL (or any other lithography technique able to pattern submicrometer features), EGaIn transfer using a stamping process, and soft material encapsulation and final release from the silicon (Si) carrier wafer. The process starts by spin-coating a water-soluble sacrificial material (poly(acrylic acid), PAA) on a silicon wafer at 2000 rpm for 30 seconds and baking the film at 100° C. for 60 seconds. On top of the PAA sacrificial layer, a 600-nm-thick parylene-C barrier film is deposited by chemical vapor deposition (CVD) in order to protect the underlying PAA during the subsequent EGaIn patterning as well as while releasing the fabricated soft electronic devices from the Si wafer after the soft material encapsulation. EBL is then used to pattern a spin-coated poly(methylmethacrylate) (PMMA) layer with a thickness between 300 nm and 1 μm. After exposure in the EBL tool (Elionix ELS G-100), the PMMA film is developed using a mixture of methyl isobutyl ketone (MIBK) and isopropanol with 1:1 ratio. Alternatively, other lithography processes with submicron resolution can be considered for this step. In the next step, a stamping process is used to transfer an EGaIn thin film onto the patterned PMMA structures. To improve the adhesion and uniformity of the stamped EGaIn on the parylene-C-coated substrate, a biphasic structure was adopted. To this end, a thin metallic adhesion layer (such as Ti/Au, 5 nm/30 nm in thickness) is first deposited using electron-beam evaporation on the patterned PMMA nano/microstructures. The purpose of this metallic adhesion layer is to enhance the adhesion and wetting characteristics during the EGaIn stamping process while maintaining EGaIn's electrical and mechanical properties. Then, a non-structured PDMS stamp is wet with EGaIn and gently pressed 2-3 times onto the Au-coated nano/microstructures, transferring a thin EGaIn film which forms an alloy with the underlying Au adhesion layer. A PMMA lift-off process with acetone is then used to pattern the stamped EGaIn on Au.

To highlight the impact of the Au adhesion layer on the EGaIn wettability, the EGaIn stamping process was carried out on patterned PMMA structures without and with the use of the Au adhesion layer. Without the adhesion layer, the stamped EGaIn is not uniformly spread onto the patterned PMMA structure, resulting in non-uniform and rough EGaIn surfaces with EGaIn droplets as well as non-covered areas after PMMA lift-off. In contrast, by utilizing the Au adhesion layer during the EGaIn stamping process, the stamped EGaIn uniformly spreads across the Au film and fills concave nano/micropatterns up to the designed PMMA thickness. The EGaIn stamped on the Au adhesion layer demonstrated strong adhesion and uniform wetting and, therefore, could be successfully patterned using the PMMA lift-off process without any structural deformation.

Next, the remaining EGaIn structures are covered with a soft elastomer (e.g., poly(dimethyl siloxane), PDMS), and the fabricated devices are released from the Si carrier wafer by dissolving the sacrificial PAA layer in water for at least six hours. Finally, the parylene-C barrier layer is etched using an oxygen plasma in a reactive-ion etching (RIE) system, and the back side of the soft electronic device is sealed with a soft elastomer. It should be noted that optical lithography with a positive-tone photoresist can be utilized as well for the microstructure fabrication. Moreover, other lithography techniques able to pattern submicron-scale sacrificial structures, such as direct laser writing 54 or 3D nanoprinting, can be potentially utilized for cost-effective fabrication.

The following paragraphs describe methods employed in a second experimental embodiment:

Nano/Microstructure Fabrication Process:

A water-soluble sacrificial layer, poly (acrylic acid) (PAA, Polyscience, Inc.), was spun on a Si wafer at 2000 rpm for 30 s and baked at 100° C. for 60 s, resulting in ≈2 μm film thickness. On top of the PAA sacrificial layer, a parylene-C film with 600 nm thickness was deposited by chemical vapor deposition (CVD, SCS Labcoter PDS 2010). For nano/microstructure definition, electron-beam lithography (EBL, Elionix ELS G-100) was utilized to pattern spin-coated poly(methylmethacrylate) (PMMA, Micro-Chem Corp.) films with thicknesses ranging from 300 nm to 1 μm. In the EBL process, the samples with different PMMA thicknesses were all exposed using a 1-nA current with a proximity effect correction ($\beta=30$ and $\eta=0.6$). The applied dose was adjusted from 400 μC cm-2 to 630 μC cm-2 because of the different PMMA thicknesses. For example, a dose of 510 μC cm-2 was selected for the 1-μm-thick PMMA film. Then, a thin metallic adhesion layer, either Ti/Au or Ti/Cu, was deposited onto the PMMA nano/micropatterns using an electron-beam evaporator with a target thickness of 5 nm/30 nm.

PDMS Stamp Preparation and EGaIn Stamping Process:

For PDMS stamp fabrication, a general replica molding process was used using an acrylic master fabricated using a CO2 laser cutter (Hermes LS500XL). Liquid PDMS (10:1 ratio of PDMS pre-polymer and curing agent, Sylgard 184, Dow Corning) was drop-casted on the acrylic master and cured at 60° C. for 8 h. PDMS stamps with various shapes (e.g. circle or rectangle) and sizes (e.g. 5 mm x5 mm to 30 mm x30 mm) were designed and fabricated to stamp EGaIn onto the Au- or Cu-coated nano/microstructures. EGaIn (gallium-indium eutectic, >%99.99 trace metal basis, Sigma-Aldrich) was dispensed on a donor PDMS substrate using a syringe and spread and flattened by a PDMS roller. In the next step, the fabricated PDMS stamp was wet with EGaIn by pressing it on the EGaIn-coated donor PDMS substrate and gently stamped 2-3 times onto the Au- or Cu-coated nano/micropatterns to transfer the EGaIn thin film. The stamped EGaIn on Au or Cu was finally patterned using a PMMA lift-off process with acetone.

Soft Material Encapsulation and Release Process:

The patterned EGaIn structures were encapsulated with liquid PDMS (10:1 ratio of PDMS pre-polymer and curing agent, Sylgard 184, Dow Corning) either by spin coating or drop casting. The fabricated soft electronic devices were then released by submerging the samples into water for >6 h. After the PAA sacrificial layer etching was completed, the fabricated soft devices were floating on the water surface and could gently be transferred to a glass substrate to etch the parylene-C layer. The parylene-C layer was etched using an oxygen plasma in a reactive-ion etching system (RIE, Vision 320 RIE) for >7 min or until the parylene-C film was completely removed. Under the etching conditions of 200 mTorr pressure and 200 W power, the tested parylene-C etch rate using oxygen plasma was ≈100 nm min-1. After etching the parlylene-C layer, the soft electronic devices were encapsulated again with PDMS for backside sealing.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a flexible electrical element configured to conduct electricity while at a room temperature, comprising the steps of:
   (a) generating a stamp so as to have a shaped surface corresponding to the flexible electrical element and chemically modifying the shaped surface of the stamp to attract a liquid phase conductor thereto;
   (b) applying the liquid phase conductor to the shaped surface, the liquid phase conductor comprising a material that remains liquid while at room temperature of the flexible electrical element;
   (c) stamping the stamp onto a receptive surface of a primary elastomer layer, wherein the receptive surface has an aspect that causes the liquid phase conductor from the shaped surface to remain on the receptive surface of the primary elastomer layer when the stamp is removed therefrom; and
   (d) applying a secondary elastomer layer to the elastomer substrate so as to seal the liquid phase conductor onto the elastomer substrate.

2. The method of claim 1, wherein the chemically modifying step comprises applying toluene to the shaped surface.

3. The method of claim 1, wherein the applying a liquid phase conductor step comprises the steps of:
   (a) applying the liquid phase conductor to an upper surface of a donor layer; and
   (b) preliminarily stamping the stamp onto the liquid phase conductor on the upper surface of the donor layer so as to transfer a portion of the liquid phase conductor on the upper surface of the donor layer to the shaped surface.

4. The method of claim 1, wherein the stamp comprises polydimethylsiloxane.

5. The method of claim 1, wherein the primary elastomer layer and the secondary elastomer layer comprise polydimethylsiloxane.

6. The method of claim 1, further comprising the step of applying a texture to the receptive surface of the primary elastomer layer prior to the stamping step.

7. The method of claim 6, wherein the step of applying a texture to the receptive surface comprises applying micro cellulose fiber to the receptive surface so as to generate a paper texture on the receptive surface.

8. The method of claim 1, wherein the liquid phase conductor comprises a eutectic alloy.

9. The method of claim 8, wherein the eutectic alloy comprises a eutectic gallium-indium alloy.

10. The method of claim 1, further comprising the step of placing a flexible via so that the flexible via is in contact with the liquid phase conductor and extends to an outer surface of at least one of the primary elastomer layer and the secondary elastomer layer so as to provide an external electrical contact to liquid phase conductor.

11. A method of making a flexible electrical element configured to conduct electricity while at room temperature, comprising the steps of:
    (a) generating a stamp so as to have a shaped surface corresponding to the flexible electrical element;
    (b) applying a liquid phase conductor to the shaped surface, the liquid phase conductor comprising a material that remains liquid while at room temperature of the flexible electrical element, wherein applying a liquid phase conductor includes the steps of:
    applying the liquid phase conductor to an upper surface of a donor layer; and
    (ii) preliminarily stamping the stamp onto the liquid phase conductor on the upper surface of the donor layer so as to transfer a portion of the liquid phase conductor on the upper surface of the donor layer to the shaped surface;
    (c) stamping the stamp onto a receptive surface of a primary elastomer layer, wherein the receptive surface has an aspect that causes the liquid phase conductor from the shaped surface to remain on the receptive surface of the primary elastomer layer when the stamp is removed therefrom; and
    (d) applying a secondary elastomer layer to the elastomer substrate so as to seal the liquid phase conductor onto the elastomer substrate.

12. The method of claim 11, further comprising the step of chemically modifying the shaped surface of the stamp to attract the liquid phase conductor thereto.

13. The method of claim 11, wherein the stamp comprises polydimethylsiloxane.

14. The method of claim 11, wherein the primary elastomer layer and the secondary elastomer layer comprise polydimethylsiloxane.

15. The method of claim 11, further comprising the step of applying a texture to the receptive surface of the primary elastomer layer prior to the stamping step.

16. The method of claim 15, wherein the step of applying a texture to the receptive surface comprises applying micro cellulose fiber to the receptive surface so as to generate a paper texture on the receptive surface.

17. The method of claim 11, wherein the liquid phase conductor comprises a eutectic alloy.

18. The method of claim 17, wherein the eutectic alloy comprises a eutectic gallium-indium alloy.

19. The method of claim 11, further comprising the step of placing a flexible via so that the flexible via is in contact with the liquid phase conductor and extends to an outer surface of at least one of the primary elastomer layer and the secondary elastomer layer so as to provide an external electrical contact to liquid phase conductor.

20. A method of making a flexible electrical element configured to conduct electricity while at room temperature, comprising the steps of:
    (a) generating a stamp so as to have a shaped surface corresponding to the flexible electrical element;
    (b) applying a liquid phase conductor to the shaped surface, the liquid phase conductor comprising a material that remains liquid while at room temperature of the flexible electrical element;
    (c) applying a texture to the receptive surface of the primary elastomer layer;
    (d) stamping the stamp onto a receptive surface of a primary elastomer layer, wherein the receptive surface has an aspect that causes the liquid phase conductor from the shaped surface to remain on the receptive surface of the primary elastomer layer when the stamp is removed therefrom; and
    (e) applying a secondary elastomer layer to the elastomer substrate so as to seal the liquid phase conductor onto the elastomer substrate.

21. The method of claim 20, wherein the applying a liquid phase conductor step comprises the steps of:
    (a) applying the liquid phase conductor to an upper surface of a donor layer; and
    (b) preliminarily stamping the stamp onto the liquid phase conductor on the upper surface of the donor layer so as to transfer a portion of the liquid phase conductor on the upper surface of the donor layer to the shaped surface.

22. The method of claim 20, wherein the stamp comprises polydimethylsiloxane.

23. The method of claim 20, wherein the primary elastomer layer and the secondary elastomer layer comprise polydimethylsiloxane.

24. The method of claim 20, wherein the liquid phase conductor comprises a eutectic alloy.

25. The method of claim 20, further comprising the step of placing a flexible via so that the flexible via is in contact with the liquid phase conductor and extends to an outer surface of at least one of the primary elastomer layer and the secondary elastomer layer so as to provide an external electrical contact to liquid phase conductor.

* * * * *